United States Patent [19]

Hagiwara

[11] 4,242,692
[45] Dec. 30, 1980

[54] CHARGE TRANSFER DEVICE WHICH HAS A PAIR OF STRAIGHT PORTIONS JOINED BY A DIRECTION CHANGING PORTION

[75] Inventor: Yoshiaki Hagiwara, Yokohama, Japan

[73] Assignee: Sony Corporation, Tokyo, Japan

[21] Appl. No.: 44,224

[22] Filed: May 31, 1979

[30] Foreign Application Priority Data

Jun. 2, 1978 [JP] Japan .................. 53/66561
Apr. 6, 1979 [JP] Japan .................. 54/13283

[51] Int. Cl.³ .................. H01L 29/78; G11C 19/28
[52] U.S. Cl. .................. 357/24; 307/221 D
[58] Field of Search .................. 357/24; 307/221 D

[56] References Cited

U.S. PATENT DOCUMENTS

| 3,921,194 | 11/1975 | Engeler et al. | 357/24 |
|---|---|---|---|
| 3,967,306 | 6/1976 | Bower | 357/24 |
| 3,971,003 | 7/1976 | Kosonocky | 357/24 |
| 4,064,524 | 12/1977 | Hagiwara et al. | 357/24 |
| 4,133,099 | 1/1979 | Hagiwara | 357/24 |
| 4,160,262 | 7/1979 | Kovac | 357/24 |

*Primary Examiner*—Gene M. Munson
*Attorney, Agent, or Firm*—Hill, Van Santen, Steadman, Chiara & Simpson

[57] ABSTRACT

The present invention relates to a charge transfer device which allows change of the charge transfer direction wherein transfer portions are formed of generally rectangular shape which have a length in the charge transfer direction which gradually gets longer to the transition direction change area and widths which get smaller relative to the direction transverse to the charge transfer direction. The length times width of the transfer portions is made substantially constant. The feature providing that the transfer regions become narrower as they approach the portion of charge direction change allows the charge direction change to be relatively shorter than apparatus of the prior art thus resulting in greater efficiency, shorter charge transfer time, eliminates the requirement for direct current bias and a more integrated device is provided.

15 Claims, 13 Drawing Figures

CHARGE TRANSFER DEVICE WHICH HAS A PAIR OF STRAIGHT PORTIONS JOINED BY A DIRECTION CHANGING PORTION

BACKGROUND OF THE INVENTION

1. Field of the Invention

This invention relates in general to charge transfer devices such as a CCD (charge coupled device) and in particular to an improved electrical charge transfer device in which large number of bits can be transferred in the CCD and in which the direction of charge transfer can be changed intermediate the input and output of the device.

2. Description of the Prior Art

CCD delay lines sometime are required with a large number of storage and transfer positions and if such devices capable of storing a large number of bits are arranged in a straight line, the semiconductor chip will become very large and it is difficult to design and manufacture it. For this reason, it is desirable that the channel be folded or bent intermediate its ends so as to change the charge transfer direction and therefore make the device in a more compact package.

FIGS. 1 and 2 illustrate prior art charge coupled devices in which the change of direction of charges intermediate the input and output occur. For example, in FIG. 1, a semi-conductor substrate 1 having a first conductivity type such as P type conductivity is provided with a channel stopper region 2 which consists of a higher impurity concentrated region of the first conductivity type and is formed on the surface of the substrate 1. Charge transfer portions 3 consists of a plurality of transfer regions 4 (4$\phi$1, 4$\phi$2) which are aligned in the charge transfer direction. In the embodiment of FIG. 1, the charges pass from the input 3A as shown by the arrow to the right then pass upwardly as shown by the curved arrow through the direction changing portion 5 to the output area 3B as shown by the arrow at the top of the Figure wherein the charges are moving to the left relative to FIG. 1. In the embodiment illustrated in FIG. 1, a 180° of charge transfer direction occurs in the direction changing portion 5. The direction changing portion 5 is formed of a diffusion region 6 of a second conductivity type such as an N-type conductivity. Each of the transfer regions 4 is formed of a transfer electrode 8 such as 8$\phi$1, 8$\phi$2 which are formed on the substrate 1 over an insulating layer 7 as for example, of silicon dioxide. The electrodes 8$\phi$1, 8$\phi$2 are alternatingly arranged and driving clock pulses of $\phi$1 and $\phi$2 are applied to the alternate electrodes to provide charge transfer. An electrode 9 illustrated in FIG. 2a is provided on the substrate 1 over the insulating layer 7 in the region adjacent the direction changing portion 5 and a fixed DC voltage is applied to electrode 9 so as to fix the voltage of the diffusion region 6 between the regions 4$\phi$1 and 4$\phi$2 adjacent the diffusion region 6 of the direction changing portion 5. An electrical charge 12 will be sequentially transferred by the clock pulses $\phi$1 and $\phi$2 of the two phase driving signal through the transfer region 4 in a first direction, for example, to the right of the Figure then through the direction changing portion 5 and back in the opposite direction as illustrated by the arrow at the top of the Figure in FIG. 1. This transfer is accomplished by the potential 10 illustrated in FIG. 2a and potential 11 illustrated in FIG. 2b wherein it is noted that the charge 12 moves from the left of FIG. 2a to the right in FIG. 2b.

In the charge transfer devices such as described and illustrated in FIGS. 1 and 2, since the direction changing portion 5 is formed of the diffusion region 6, defects will be caused because the area occupied by the direction changing portion is relatively large and has a substantial length and the electrode 9 which receives the DC voltage is required so as to fix the voltage of the diffusion region 6 and thus the direction changing portion 5 becomes complicated in construction and it also becomes complicated to apply the drive voltage. In addition, since the electrodes 8$\phi$1 and 8$\phi$2 which overlie the transfer portions in both the areas 3A and 3B are connected to each other and receive the same driving pulses, however, they are offset from each other by one bit shift as illustrated by the diagonal portions of the electrodes extending between the regions 3A and 3B. Thus, the electrode 8$\phi$1 in the region 3A is connected by an oblique portion 100 to the corresponding electrode 8$\phi$1 in the region 3B. In order to prevent the portion 100 from being extremely narrow, the channel stopper 2 is made relatively long as indicated by the dimensions 11. Thus, the formation of the electrodes 8 is relatively complicated and the width 12 of the diffusion region 6 becomes wide which deteriorates the integrating density and adversely effects the loss and efficiency of charge transfer in the direction changing portion 5.

It has also been proposed to form the direction changing portion with a CCD. In such arrangements, the respective transfer electrodes in the direction changing portion are formed as sector shapes so as to form a channel path of generally similar semicircular configuration and hence to change the transfer direction of charges. This structure results in an increase in the number of bits of the CCD in the direction changing portion which increases and the result is that the charge transfer in the direction changing portion is apt to be disturbed and the direction changing portion occupies a greater area which lowers the integration density of the device.

SUMMARY OF THE INVENTION

It is the main object of the present invention to provide an electrical charge transfer device in which the diffusion region utilized in the prior art as well as the CCD bias electrodes are eliminated such that the construction in the direction changing portion is simplified and the manner in which the DC drive voltage is applied is also simplified and the complete charge transfer is performed in the direction changing portion and the area occupied by the direction changing portion is substantially decreased to a minimum so as to allow the device to be highly integrated.

With the present invention, a charge transfer region of a CCD construction is utilized in which the transfer electrode is formed of a single layer and a so-called asymmetrical potential well is formed beneath the transfer electrode and the direction changing portion where the charge is changed and transferred from a path in one direction to a path in the opposite direction is formed of a CCD.

Thus, in the present invention, a diffusion area nor DC bias electrode is utilized or required in the direction changing region so the device can be greatly simplified and is small in size and inexpensive to manufacture.

In the present invention, the direction changing area accomplishes charge transfer completely and such area is less than in the prior art devices which results in a greater integrated device. Because of the small area where the direction transfer occurs, the distance travelled by the charges will be shorter than those of the prior art so the time of transfer will be shorter and transfer losses will become negligible thus rendering the transfer efficiency very high. Also, relative to the prior art, the area between the charge transfer electrodes will be shorter and the electrodes can be narrower. In the present invention, the channel stopper is narrower than in the prior art.

In the present invention, direction transfer of charges is accomplished with CCD electrodes and two phase change transfer can be accomplished with a single layer structure which results in a very simple device.

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure and in which:

DESCRIPTION OF THE PREFERRED EMBODIMENTS

For more complete understanding of the present invention, reference may be made to U.S. Pat. No. 4,064,524 which issued on Dec. 20, 1977 assigned to the assignee of the present invention in which the inventors are Yoshiaki Hagiwara and Hiroshi Yamazaki. In addition, the copending application Ser. No. 841,551 filed Oct. 12, 1977 now U.S. Pat. No. 4,179,793 which issued on Dec. 25, 1979 entitled "Method of Making A Charge Transfer Device, " in which the inventior is Yoshiaki Hagiwara, the inventor in the present application and assigned to the assignee of the present application discloses the method of making charge transfer devices and such methods may be utilized for constructing the present invention.

Figure 1:
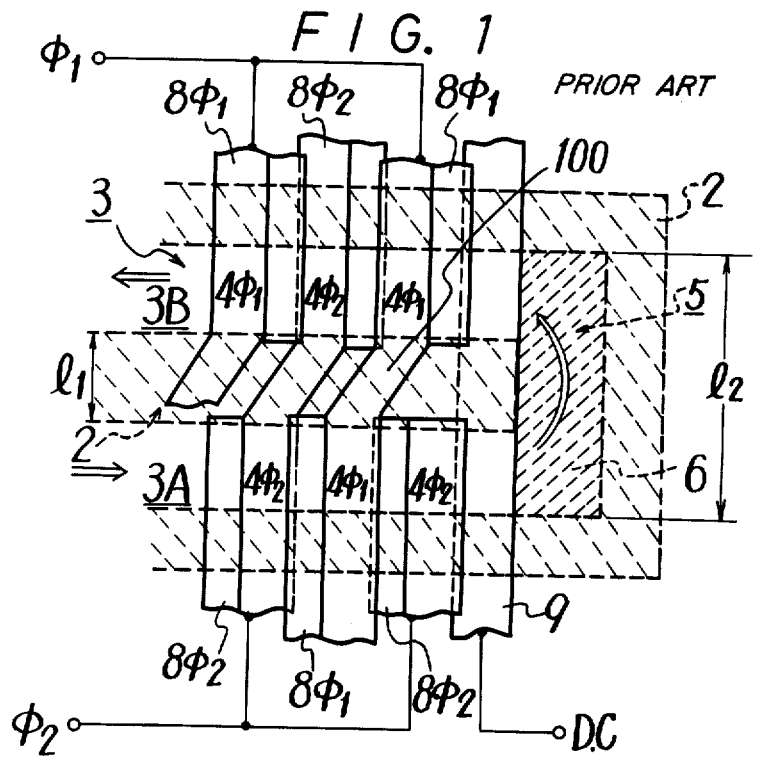
FIG. 1 is a plan view illustrating a prior art electrical charge transfer device.
Figure 2A:
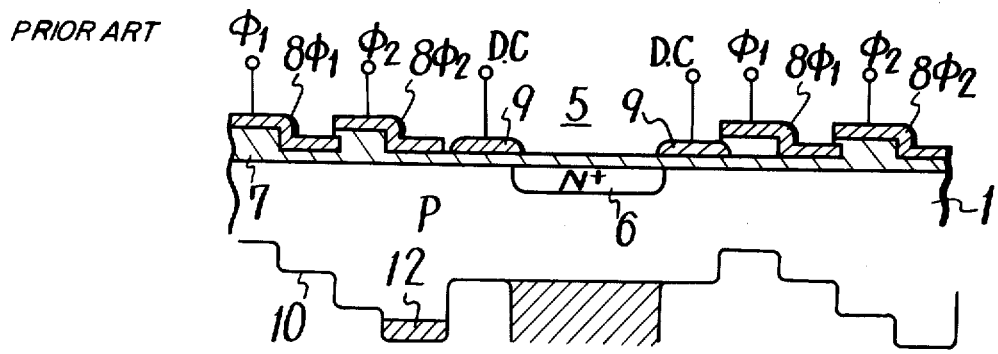
FIGS. 2a and 2b are cross-sectional views taken in FIG. 1 so as to illustrate the potential distribution diagrams.
Figure 2B:
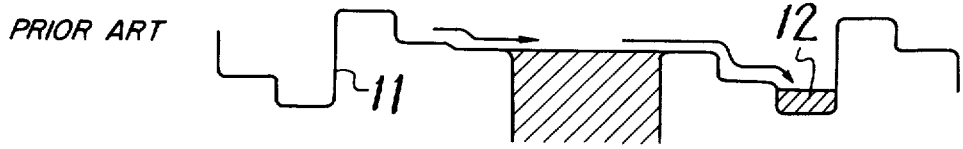
Figure 3:
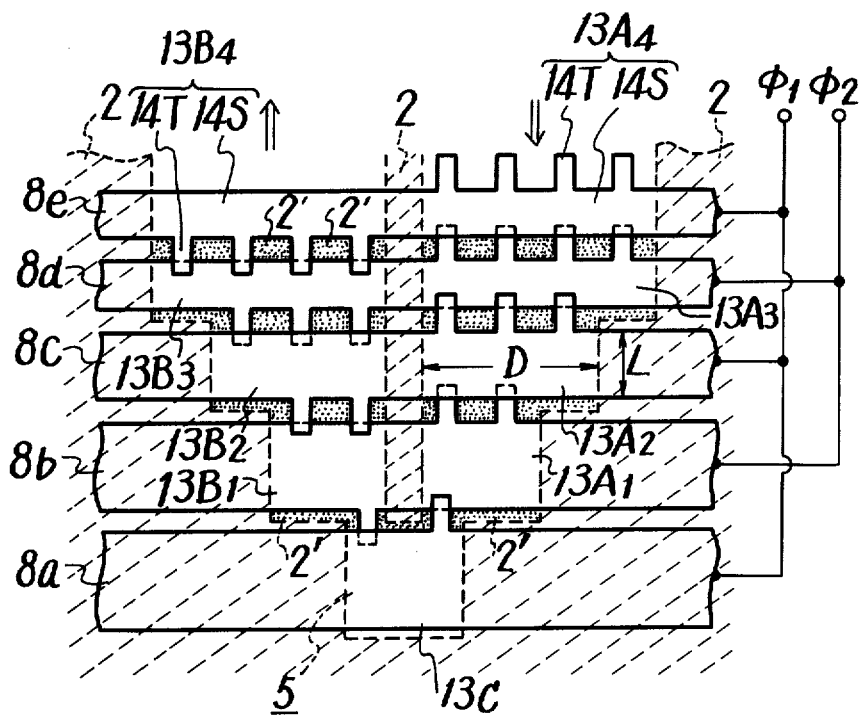
FIG. 3 is a plan view illustrating a charge transfer device according to the present invention.
Figure 4:
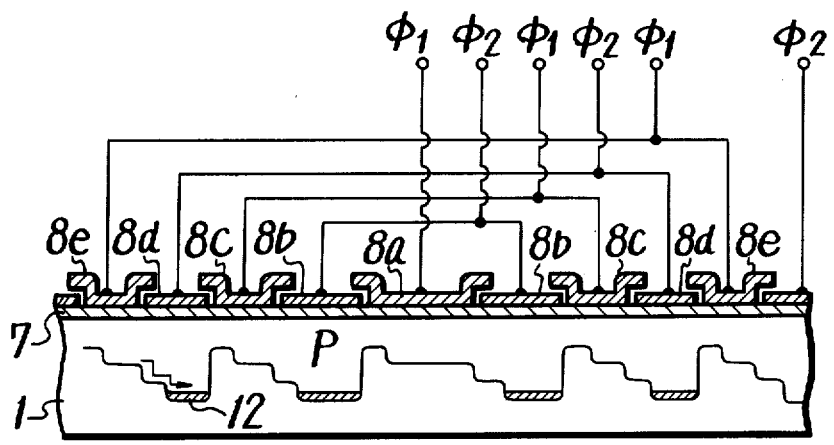
FIG. 4 is a sectional view along the charge transfer direction of FIG. 3 device.

FIGS. 3 and 4 illustrate a first embodiment of the present invention and as shown in the Figures wherein FIG. 3 is a top plan view of the invention and FIG. 4 is a sectional view taken along a line in the charge transfer direction as, for example, in the direction of the arrows in FIG. 3.

As shown in FIG. 4, a substrate of a first conductivity type as, for example, P-type conductivity has formed therein channel stopper regions 2 which are also a P-type conductivity and have impurity concentration higher than that of the substrate 1. The channel stopper regions 2 define a charge transfer path from a region at the upper right portion of FIG. 3 down to the center to a direction changing portion 13c and then up to the left as illustrated by the arrow to the upper left of the Figure. The channel stopper region 2 has a center portion which separates the right and left portions of the device and outer limiting portion 2 which is formed as shown in the plan view 3. In the device illustrated in FIGS. 3 and 4, the charge transfer direction changes by 180°. The channel stopper areas 2 are formed by diffusion from one major surface of the substrate 1.

A plurality of transfer electrodes 8 identified as 8e, 8d, 8c, 8b and 8a are formed on an insulating layer 7 formed on the surface of the substrate 1. The insulating layer 7 might be silicon dioxide or other suitable material and the electrodes 8a through 8e are formed substantially parallel to each other and each of the electrodes are formed so as to commonly intercept the downwardly and upwardly travelling paths of the charges through the device relative to FIG. 3. Thus, electrode 8e extends from the channel stopper 2 on the right of FIG. 3 across the downward charge transfer region 13A to the center channel stopper region 2 and then across the upward charge transfer region 13B to the left channel stopper region 2. The other electrodes 8d, 8c and 8b likewise extend across the region 13A where the charge is moved downwardly and the region 13B where the charge is moved upwardly relative to FIG. 3 as shown.

A transfer region 13C is formed beneath electrode 8a and provides a direction changing portion 5 wherein the downwardly passing charges from region 13A pass transversely to the left relative to FIG. 3 and then upwardly into the upwardly moving charge transfer regions 13B.

In the present invention, since each of the transfer electrodes 8a through 8e extend over the respective down and up charge transfer portions the transfer regions 13A1, 13B1; and 13A2, 13B2; 13A3, 13B3; and 13A4 and 13B4 which are adjacent each other on opposite sides of the central channel stopper region 2, they can be supplied with the same clock pulse $\phi 1$ or $\phi 2$ in contrast to apparatus of the prior art which must be offset from each other by one bit.

In the down and up transfer regions 13A and 13B, respectively, the length L which is in the direction of charge transfer and the width D which is transverse to the direction of charge transfer of each of the storage portions 14S of the transfer regions vary and as such regions approach the direction changing portion 5 the length L of the storage portions 14S becomes longer but the width D becomes narrower. The area of the storage portions 14S remains constant by varying the dimensions D and L so that their product remains substantially constant. This can be clearly observed in FIG. 3 wherein the distance between the center channel stopper 2 and the edge channel stopper 2 becomes substantially greater as the distance from the direction changing region 5 increases and the length L becomes substantially smaller as the distance from the direction changing region 5 increases.

The change in dimensions L and D is made symmetrical with respect to the right and left portions of the charge transfer device as shown. Thus, in examples of the invention illustrated in FIGS. 3 and 4 the length L of the transfer electrodes 8 in the charge transfer direction is selected to be longer as the electrodes approach the direction changing portion 5 so as to make the length L of the storage portions 14S long and the distances between the channel stopper regions 2 become narrower in a stepped manner to thereby decrease with width D of the storage portions 14S as the direction changing region 5 is approached. Since the width D becomes small and the length L becomes longer as the direction changing portion 5 is approached, the width of the storage portion in the direction changing portion 5 can be made small so that the path through which the electrical charges flow by diffusion in the direction changing portion can be short and, thus, the charge transfer time in the region 5 will be short and the transfer loss can be reduced and the efficiency will be increased.

Figure 5:
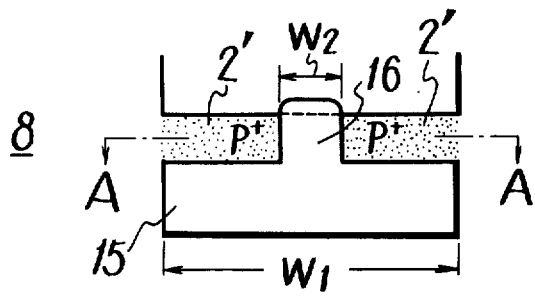
FIG. 5 is an enlarged plan view illustrating a portion of the device in FIG. 3.

As illustrated in FIG. 5 in an enlarged scale, in each of the transfer regions 13A, 13B and 13C the transfer electrodes 8 are formed to have a pattern with a wide portion 15 which has a width W1 in the direction perpendicular to charge transfer direction and additionally the electrodes 8 have narrower extending portions 16 which have a width W2 in the direction perpendicular to the charge transfer direction which is narrow. In the semiconductor regions at both sides of the narrow portion 16 which has no electrodes, channel stopper regions 2' are formed for example, by ion implantation methods or the like. The narrow width portions 16 of the transfer electrodes 8 extend in opposite directions in the up and down (relative to FIG. 3) charge transfer direction and generally extend in the direction from which the charges originate. In the transfer regions 13A, 13B and 13C the potentials formed beneath wide portions 15 and the narrow portions 16 of the electrodes 8 are asymmetrical and the portion beneath the wide width portion 15 serves as a so-called storage portion 14S while the portion beneath the narrow width portion 16 serves as a so-called transfer portion 14.

Figure 6:
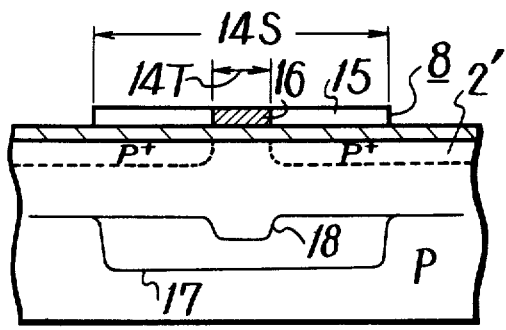
FIG. 6 is a sectional view along line A—A from FIG. 5.

In other words, when the clock pulse $\phi_1$ or $\phi_2$ is applied to the transfer electrode 8 as shown in FIG. 6, a deep potential well 17 is formed beneath the wide width portion 15 of the electrode 8, in other words, the portion having the long distance between the channel stopper regions 2, while a shallow potential well 18 is formed beneath the narrow width portion 16 in other words, the portion above the short distance between the channel stopper region 2', due to the influence of the potentials in the channel stopper regions 2'. It is to be realized that the depth of the potential well in the portion beneath the narrow width portion 16 will be different during the time when it is supplied with the clock voltage and during the time when it is not supplied with the clock voltage. For this reason, the distribution of potential on the surface of the respective transfer regions 13A, 13B and 13C in the charge transfer direction between the forward and rearward edges of the transfer region which will give asymmetrical distribution of potential. The method of constructing the electrodes and channel stopper regions may be as disclosed in the U.S. Pat. No. 4,064,524 and in the U.S. Ser. No. 841,551 filed on Oct. 5, 1977 now U.S. Pat. No. 4,179,793 which issued on Dec. 25, 1979 both of which are assigned to the assignee of the present invention.

With the illustrated construction when clock pulses $\phi_1$ and $\phi_2$ of two phase are applied to alternate ones of the respective transfer electrodes 8a, 8b, 8c . . . , as is apparent from FIG. 4, the potential on the surface of the substrate beneath each of the transfer electrodes supplied with the clock pulse $\phi_1$ or $\phi_2$ becomes lower than that beneath each of the other transfer electrodes, but the surface potential of the portion beneath the narrow width portion 16 of the respective transfer electrodes becomes higher than that beneath the wide portions 15. For this reason, the charges will be transferred to the respective transfer regions with directional control due to the asymmetry of the potential well. Thus, in the apparatus of FIG. 3, the charges will be transferred from the transfer regions T to the adjacent storage regions such that charge transfer will occur between 13A3 to 13A2 to 13A1 and then into the direction changing portion 5 through the transfer region 13C and then into the transfer region 13B1 then to transfer region 13B2 and then into the transfer region 13B3 and then into the transfer region 13B4.

According to the example of the invention constructed as described above, the transfer regions are each capable of being driven by two phase clock signals because the transfer electrode of the single layer construction is used and the downwardly moving charge path and the upwardly moving charge path relative to FIG. 3 as well as the direction changing portion 13C are formed as a CCD device of a similar construction which results in the diffusion region, the DC bias electrodes and other parts required in the prior art devices can be eliminated. In addition, the area occupied by the direction changing portion 5 is reduced in size and the construction of the direction changing portion becomes much simpler than such devices of the prior art and the manner in which the drive voltage is supplied is simplified since the two phase clock voltage is sufficient. Furthermore, in the respective transfer regions especially in the storage portions 14S while each of these areas is maintained constant the length L becomes successively larger as the direction changing portion 5 is approached and the width D becomes successively smaller as the direction changing portion 5 is approached. The storage portions 14S in the upward charge direction portion to the left of FIG. 3 are formed symmetrical with the downward charge moving portions relative to FIG. 3 illustrated to the right of FIG. 3. Thus, the effective channel length in the direction changing portion can be relatively short and thus the transfer loss of charges can be reduced and the efficiency increased relative to devices of the prior art.

In addition, since the direction changing portion is formed by a single transfer region and only one transfer electrode 8a in the present invention, the corresponding electrodes of the transfer regions in the downwardly and upwardly charge moving paths relative to FIG. 3 can all be formed be as straight electrodes as illustrated in FIG. 3. This allows the distance between the downwardly and upwardly moving charge path relative to FIG. 3 to be selected and constructed as narrow regions and, thus, the integration density of the charge transfer line in the semiconductor chip can be increased which results in an improvement. Thus, in the present invention applied to a charge transfer device such as a CCD a very large number of bits can be utilized.

Figure 7:
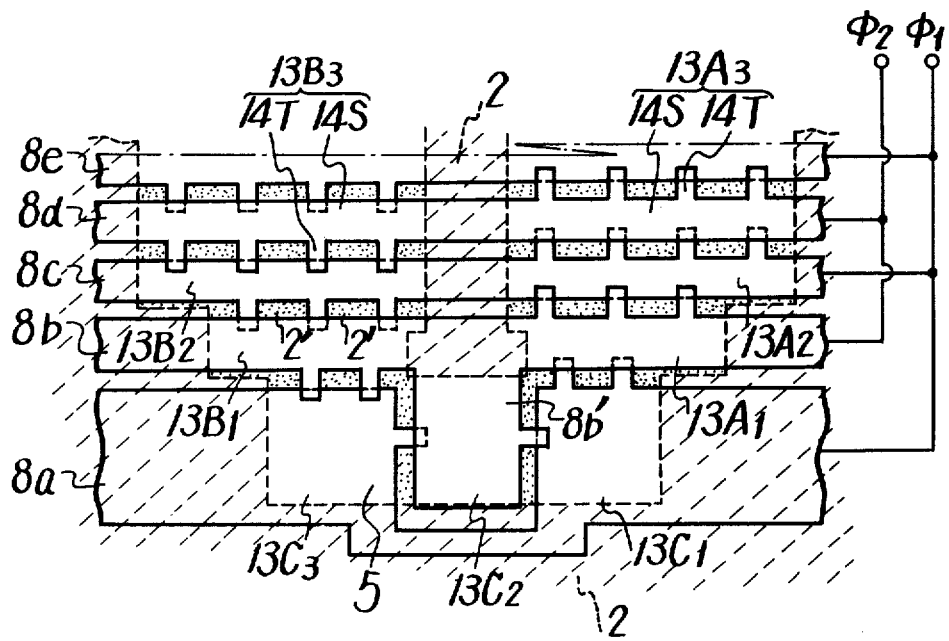
FIG. 7 is a plan view illustrating a modification of the invention.

In the example of the invention illustrated in FIG. 3, the direction changing portion 5 is formed by one transfer region 13C of the transfer electrode 8a but the direction changing portion can also be formed with three transfer regions as illustrated in the embodiment illustrated in FIG. 7. In the example of the invention illustrated in FIG. 7, the direction changing portion 5 is formed in a manner such that a center portion 18b' of the transfer electrode 8b which serves for a transfer electrode for the transfer regions 13A1 and 13B1 adjacent the direction changing portion 5 extends to form a transfer region 13C2. In addition, the common transfer electrode 8a extends at the left and right sides of transfer region 13C2 to form transfer regions 13C1 and 13C3 which are coupled to the transfer region 13C2 as well as to the transfer region 13A1 in the downward charge travel path relative to FIG. 7 and to the transfer region 13B1 in the upward charge travelling path relative to FIG. 7. A generally U-shaped opening is formed in the electrode 8a to fit about the portion 8b' of the electrode 8b and a pair of extending transfer regions extend from the portion 13C1 toward the electrode 8b in the region 13A1 and an extending region extends from region 13C3 over the region 13C2 to transfer charge from the region 13C2 to the region 13C3. It is desirable that the respective transfer regions 13C1, 13C2 and 13C3 which serve to change the charge transfer direction be selected to be the same area and generally the same shape. The embodiment illustrated in FIG. 7 may be considered as comprising two 90° direction changing areas rather than a single 180° changing area as the embodiment illustrated in FIG. 3. Other constructions such as making multi-folds of the device may also be utilized.

Figure 8:
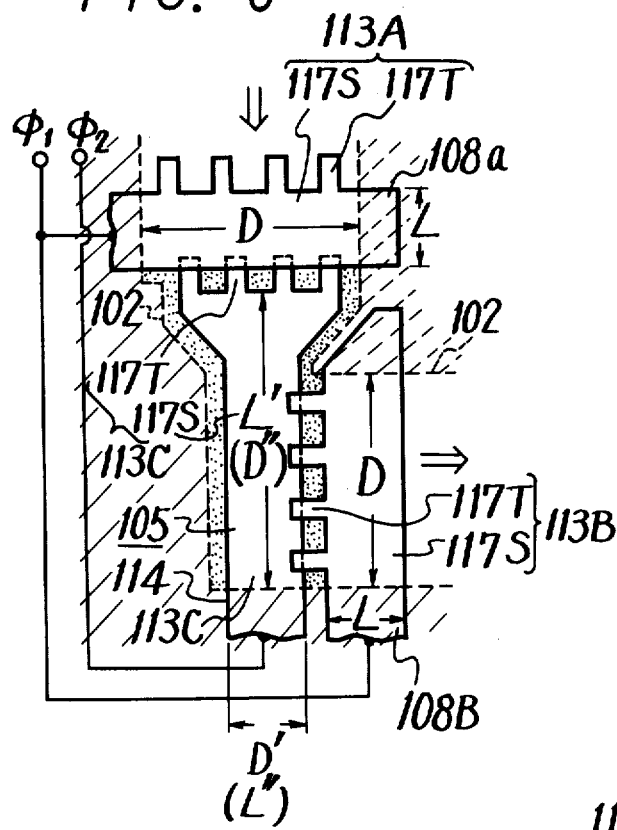
FIG. 8 is a plan view illustrating a further modification of the invention.
Figure 9:
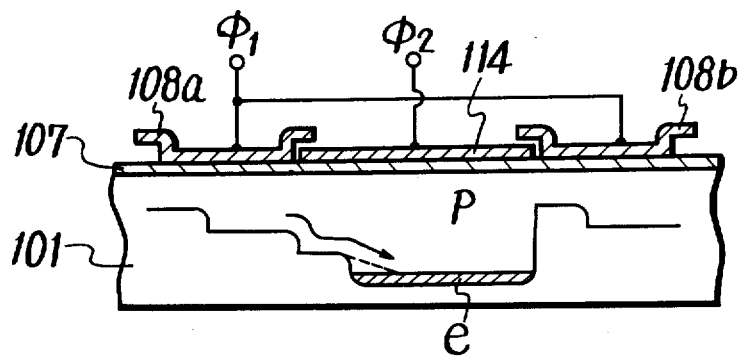
FIG. 9 is a cross-sectional view in the charge transfer direction from FIG. 8.

Another example of the charge transfer device of a CCD type according to the invention is illustrated in FIGS. 8 and 9. In this embodiment on one major surface of the P-type semiconductor substrate 101 there is formed by diffusion or a similar process a channel stopper region such as the region 102 which defines a charge transfer line for changing the charge transfer direction by 90°. The region 102 has the same cnductivity type as the substrate 101 but has higher impurity concentration than the substrate 101 and is indicated by hatched lines in FIG. 8. A plurality of transfer electrodes 108 are formed on the surface of the substrate 101 over an insulating layer 107 made of silicon dioxide or other similar substance. It is to be realized that although only a single electrode 108a is illustrated, that a plurality of charge transfer storage and transfer regions and other electrodes 108 may be arranged above the electrode 108a in FIG. 8. An electrode 108B extends in a direction at right angles to the electrode 108a and between the electrode 108a and the electrode 108B is formed a direction changing electrode 114 over a direction changing portion 105. The transfer electrode 114 has a specific shape which includes a plurality of charge transfer regions 117T which extend toward the electrode 108a and the electrode 108B has a plurality of extending portions 117'T as shown. In the charge transfer regions 113A and 113B, the surface potential distribution in the charge transfer direction is asymmetrical relative to the front and rear sides of the transfer regions for the reasons described relative to the embodiments illustrated in FIGS. 5 and 6.

In the first and second transfer regions 113A and 113B their storage portions 117S and 117'S are so formed that their length L parallel to the charge transfer direction is short but their width D which is at right angles to the charge transfer direction is long. In other words, L is less than D. Thus, they are rectangular shaped with a narrower dimension being in the charge transfer direction. The respective transfer electrodes 108a and 108B as shown in FIG. 8 are formed to have a pattern such that each of them has a wide width portion and a plurality of narrow width portions which extend from one side of the electrodes. These narrow width portions are arranged at uniform distances. In the transfer region 113C of the direction changing portion 105 its storage portion 117"S has a shape such that its width D' is smaller than the width D of the storage portion 113A and its length L' is selected to be greater than the length L of the storage portion 113A. Relative to the storage portion 113B, the width D" of the storage region 113C is greater than the width D of the storage portion 113B and the length L" of the storage portion 113C is less than the length L of the storage portion 113B. It is to be realized that the length and width dimensions relative to the electrodes 113A and 113B change in view of the 90° orientation and this is illustrated by the dimensions in FIG. 8, for example. The storage portion 117S" of the transfer region 113C in the direction changing portion 105 is formed as a rectangle which is long in the direction viewed from the transfer region 113A. In this example, the storage portions 117S, 117S' and 117S" of the transfer regions 113A, 113B and 113C are selected to be equal in area. The transfer electrode 114 in the direction changing portion 105 has a wide width portion 115 which makes the electrode 114 wider adjacent the electrode 108a and formed with a plurality of equally spaced transfer regions 117T" which are arranged almost the entire width D of the storage portion 117T below electrode 108a. This is shown in detail in FIG. 10. In this example, only three extending transfer portions 116a in the center of the electrode 115 and side electrodes 116b and 116b' are illustrated. The center electrode 116a has a relatively narrow width W2 transverse to the charge transfer direction whereas the electrodes at either side thereof, 116b and 116b', are connected to the electrode 115 with wider portions so that the dimension W2' transverse to the direction of charge flow through the portions 116b and 116b' will be greater than the width W2. In other words, in the central narrow width portion 116a of the plurality of narrow width portions 116 it is desired to maintain the width relatively narrow, but the outside portions 116b and 116b' have the same width W2 adjacent the electrode 110 but the outer electrodes 116b and 116b' have increased widths W2' adjacent the electrode 115 as shown. Thus, the electrode 115 is formed in the shape of a fork.

Figure 10:
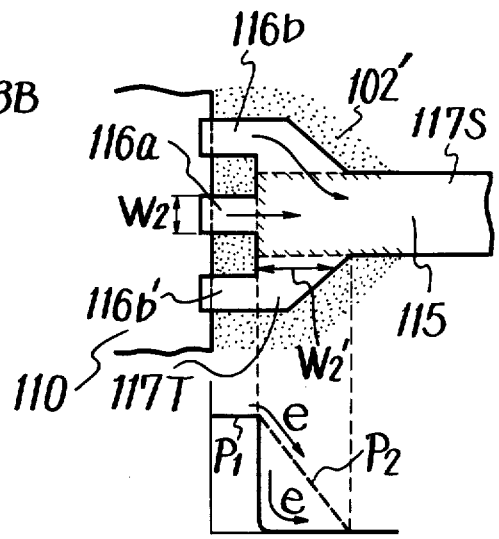
FIG. 10 is an enlarged plan view illustrating the potential distribution diagram so as to explain the invention shown in FIGS. 8 and 9.

The practical storage portion 117S when the fork type transfer electrode 114 is used is shown by the hatched lines in FIG. 10 and the remaining portions serve as the transfer portion 117T. When the narrow width portions 116 are increased in width in the transfer direction as illustrated in FIG. 10, the charges flowing therethrough will be transferred very rapidsly to the next storage portion due to the electrical field effect. That is, as shown in the potential diagram of FIG. 10 the potential P1 beneath the central narrow width portion 116a of the same width is the same in level all over the effective length of the transfer portion and becomes deep very sharply at the arrival of the storage portion 117S. On the other hand, the potential beneath the narrow width portions 116b and 116b' which become wider as shown by W2' in the transfer direction can be indicated as the inclined potential P2 in FIG. 10 due to the decreased influence of the channel stopper regions 102' on both sides with respect to the transfer direction and hence the charge e will be transferred to the storage portion rapidly in view of this effect. Therefore in the direction changing portion 105 illustrated in FIG. 8 regardless of whether the effective length of the transfer portion is long or short the charge from the entire length of the preceding electrode 110 can be transferred to the next storage portion beneath the electrode 115 very rapidly.

In the charge transfer device of this invention, when two phase clock pulses $\phi 1$ and $\phi 2$ are applied to the respective transfer electrodes 108a, 114 and 108b alternately as illustrated, for example, in FIG. 9, the potential on the surface of the substrate 101 beneath the transfer electrode which is supplied with the clock pulse $\phi 1$ or $\phi 2$ will become lower than that beneath the other transfer electrode. But the surface potential of the substrate 101 beneath the narrow width portion 116 of each of the transfer electrodes will become higher than that beneath the wide width portion 115. For this reason, the charges will be transferred by the respective transfer regions in the direction of the arrows illustrated in the Figures due to the asymmetry of the potential wells formed in the substrate 101 beneath the electrodes. The charge transfer from the first transfer region 113A to the transfer region 113C of the direction changing portion 105 can be achieved by the fork type transfer electrode 114 without transfer loss for the reasons set forth above and the charge transfer from the transfer region 113C to the second transfer region 113B can be accomplished with high efficiency since the storage portions 117S of both the regions 113C and 113B are formed such that the lengths thereof are both short in the transfer direction and the widths thereof are both formed to be wide. Thus, the charge e will be transferred from the first transfer region 113A through the transfer region 113C of the direction changing portion 105 to the second transfer region 113B after changing in direction by 90°.

Thus, according to the construction of the invention the first and second transfer regions 113A and 113B as well as the direction changing portion 105 can be formed of CCDs and the electrical charges can be changed in the transfer direction by 90° with one bit regions so that the direction changing portion 105 can be greatly simplified and will occupy a smaller area and can transfer the electrical charges completely therethrough.

Figure 11:
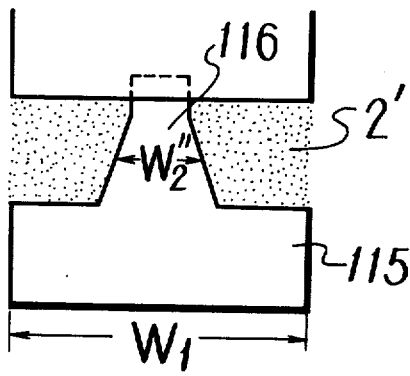
FIG. 11 is an enlarged plan view illustrating another example of the transfer electrode according to the invention.

Although the fork shaped transfer electrode is illustrated in FIGS. 8 and 10, it is to be realized, of course, that the invention is not limited to such shape. The essential concept of the present invention is that in order to apply the electrical field to the electrical charge which is transferred through a long transfer portion between a pair of storage portions and thus to decrease or eliminate a delay in transfer the narrow width portion of the rear transfer electrode is widened in the transfer direction as illustrated by W2' in FIG. 10. Thus, a variation of this concept is illustrated in FIG. 11 wherein a transfer electrode 115 has a narrow portion 116 which has a gradually increasng width W2" can be utilized. Also, a transfer electrode which has a plurality of narrow width portions with each increasing in width can also be used as the transfer electrode of the invention.

FIG. 8 illustrates a fundamental example for changing the charge transfer correction by 90°. If a plurality of devices such as illustrated in FIG. 8 are utilized, it is possible that the charge transfer direction can be changed by any multiple of 90° as, for example, 180° or so forth with the minimum number of bits.

Figure 12:
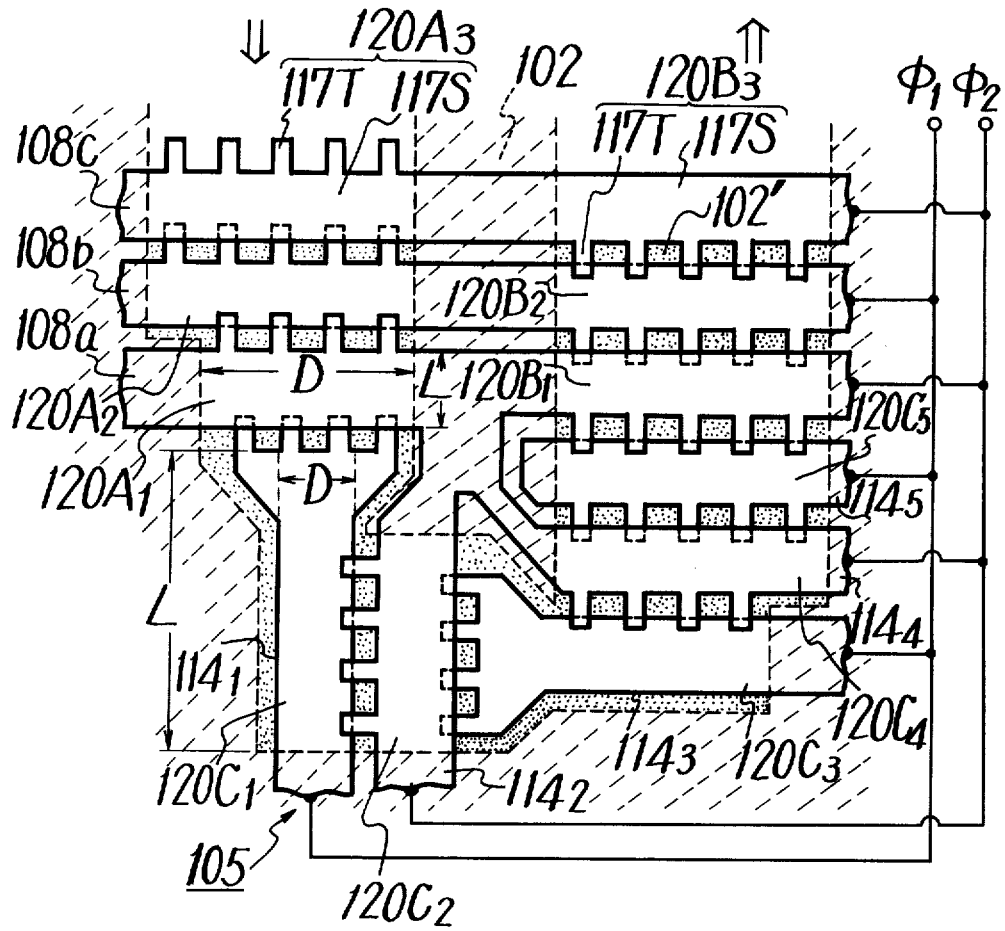
FIG. 12 is a plan view illustrating a further modification of the invention.

FIG. 12 illustrates an example of a charge transfer device which utilizes the form of the invention illustrated in FIG. 8 and wherein the direction of charge transfer is 180°. In FIG. 8, those parts and elements corresponding to those of FIGS. 8 and 9 are indicated by the same reference numerals. In the invention illustrated in FIG. 12, a plurality of transfer electrodes 108a, 108b, 108c are formed parallel to each other on the surface of the semiconductor substrate having a first conductivity type over an insulating layer such as silicon dioxide and the electrodes 108a through 108c extend over downwardly and upwardly charge direction portions as indicated by the arrows in FIG. 12 so that they commonly intersect such downwardly and upwardly charge transfer regions. The channel stopper regions 102 define the charge transfer paths and the downwardly charge travelling paths comprise the regions 120A1, 120A2, 120A3 . . . The upward charge travel path transfer regions are identified as regions 120B1, 120B2, 120B3 . . . The direction changing portion 105 is formed of transfer regions 120C1, 120C2, 102C3, 120C4 and 120C5 having shapes as illustrated and which consist of a plurality of transfer electrodes $114_1$, $114_2$, $114_3$, and $114_5$ at the transfer direction changing portions. Since each of the transfer electrodes 108a through 108c intersects the downward and upward charge travelling portions, the transfer regions 120A1, 120B1; 120A2, 120B2; 120A3, 120B3 which are formed parallel to each other on either side of the central channel stopper region 102 can be supplied with the same clock pulse $\phi 1$ or $\phi 2$ because they are aligned on the same horizontal line relative to FIG. 12. In the direction changing portion 105 there are provided first and second fork shaped transfer electrodes $114_1$ and $114_3$ in such a manner that the first fork shaped transfer electrode $114_1$ will be aligned so as to face the downwardly moving charge transfer region 120A1 and extend at right angles thereto and is connected to the transfer electrode $114_2$ which extends parallel to the intermediate transfer electrode $114_1$. The second fork shaped transfer electrode $114_3$ is formed with its fork shaped portion extending over the rear of transfer electrode $114_2$ and its main body portion extends perpendicular to electrode $114_2$ which is parallel to the upward charge travelling transfer region 120B1. Transfer electrodes $114_4$ and $114_5$ are mounted adjacent each other between the electrode $114_3$ and the region 120B1 as shown. The electrodes $114_2$, $114_4$ and $114_5$ are formed similar in shape to the electrodes 108a through 108c. In the transfer regions adjacent the direction changing portion 105, the lengths L and widths W of the storage portions 117S of the electrodes 108a through 108c, for example, are varied. for example, the length L is increased as the direction changing portion becomes closer and the width D is decreased as the direction changing portion becomes closer. The areas of the storage portions are maintained constant as the lengths and widths are varied in this manner. Especially at the transfer region 120C1 where the first fork shaped transfer electrode $114_1$ is formed, the length L of the storage portion of the adjacent transfer region 120A1 is selected to be smaller than its width D such that L is less than D and the length L of the storage portion of the rear transfer region 120C1 is selected to be greater than its width D so that L is greater than D.

In the example of FIG. 12, when two phase clock voltages φ1 and φ2 are applied to the respective transfer electrodes alternate is illustrated in the drawing, the electrical charge in the charge transfer region 120A will be changed 90° by the transfer region 120C1 of the first fork shaped transfer electrode 114₁ and the next transfer region 120C2. The direction of the charge transfer will be changed an additional 90° by the transfer region 120C3 of the second fork shaped transfer electrode 114₃ and the transfer region 120C4. As a result, the electrical charge will be transferred from the down going charge direction to the up-going charge direction relative to FIG. 12 after being changed a total of 180° by the direction changing portion 105.

With the example of the invention illustrated in FIG. 12, the charge transfer direction can be changed 180° by 2.5 bits and the area occupied by the direction changing portion can be reduced relative to the prior art and the charge transfer loss in the direction changing portion can be substantially eliminated so as to provide a device of high efficiency.

According to the examples of the invention described above, the transfer regions in which the two phase drive is possible is accomplished with one layer construction of transfer electrodes and one transfer path. The other transfer path and the direction changing portion are formed by similar CCDs so that the structure of the direction changing portion can be greatly simplified relative to the prior art and the supply of drive voltage becomes simple since two phase clock voltages can be utilized. Furthermore, in the direction changing portion, the transfer electrode is so formed that its width is selected to be narrow and its length is selected to be long relative to the charge flow direction and the narrow width portions in the long portion of the transfer portion located in the rear stage of the former storage portion is formed to be fork shaped which is made wider in the transfer direction and such fork shaped transfer electrode is perpendicular to the rectangular transfer electrode of the former transfer stage which may be long in the horizontal direction relative to the Figures and parallel to the rectangular transfer electrode of the rear stage along its horizontal direction. This assures that the charge can be completely changed in its transfer direction by 90° or 180° with the smallest bit number being used. Thus, the area occupied by the direction changing portion can be reduced relative to the prior art and the integration density of the charge transfer line in a semiconductor chip can be increased. This results in the present invention being applicable to electrical charge devices such as CCD delay line having a large bit numbers and in which high efficiency can be obtained.

Although the invention has been described with surface channel charge transfer devices, it is to be realized, of course, that they can be constructed with varied charge transfer and obtain the same advantages of the invention as described above.

Although the invention has been described with respect to preferred embodiments, it is not to be so limited as changes and modifications can be made which are within the full intended scope of the invention as defined by the appended claims.

I claim as my invention:

1. An electrical charge transfer device comprising, a semiconductor substrate having a plurality of aligned charge transfer regions and storage regions, a direction changing portion located between two of said charge transfer regions to change the charge transfer direction and wherein the charge transfer direction in at least one of said two charge transfer regions is toward said direction changing portion, a plurality of electrodes associated with said storage, transfer and direction changing regions, means for applying potentials to said electrodes, a channel stopper region having a different conductivity than said charge transfer and storage regions, defining the borders of said transfer and storage regions provided commonly to said plurality of charge transfer and storage regions and having a shape such that asymmetrical potential wells are formed in the respective charge transfer regions in the charge transfer direction, said asymmetrical potential wells and said applied potentials being effective to cause charge transfers to said storage regions each of said storage regions having length dimensions in the charge transfer direction and width dimensions in the direction transverse to the charge transfer direction and wherein the lengths of said storage regions become progressively longer and the widths become progressively shorter as said storage regions become closer spaced to said direction changing portion.

2. An electrical device according to claim 1 wherein each of plurality of electrodes have substantially the same shape of the associated storage, transfer and direction changing regions in the area where said electrodes overlie these regions.

3. An electrical device according to claim 1 wherein each of said associated transfer and storage regions comprise a cell.

4. An electrical device according to claim 1 wherein said direction changing region comprises at least one transfer region and at least one storage region.

5. An electrical charge transfer device according to claim 1 wherein the areas of said storage regions are substantially the same.

6. An electrical charge transfer device according to claim 1 wherein said direction changing portion changes the charge flow direction by 180 degrees.

7. An electrical charge transfer device according to claim 1 wherein at least one of said plurality of electrodes extends over opposite pair of said plurality of storage and transfer regions to simultaneously cause charge transfers.

8. An electrical charge transfer device according to claim 7 wherein the direction of charge transfer in said opposite pair of said transfer and storage regions is in the opposite directions.

9. An electrical charge transfer device according to claim 1 wherein said direction changing portion is formed of three storage portions and three transfer portions.

10. An electrical charge transfer device according to claim 9 wherein the areas of said three storage portions are substantially the same.

11. An electrical device according to claim 1 wherein said direction changing portion has a storage region and a plurality of charge transfer regions connected to said storage region which have variable lengths in the direction of charge transfer and variable widths in the direction transverse to charge transfer so that charges are transferred through said plurality of transfer regions during the same time.

12. An electrical charge transfer device according to claim 11 wherein said storage region has an end and adjacent sides and some of said plurality of charge transfer regions have a constant width and join said storage region on said end thereof and others of said plurality of charge transfer regions join said storage region on a side and such other charge transfer regions have a narrow portion and a tapered transition portion which join the side of said storage region.

13. An electrical charge transfer device according to claim 11 wherein said direction changing portion changes the charge direction by ninety degrees.

14. An electrical charge transfer device according to claim 11 wherein said direction changing portion includes at least two storage portions.

15. An electrical charge transfer device according to claim 11 wherein said direction changing portion includes at least three storage portions.

* * * * *